(12) United States Patent
Rappoport et al.

(10) Patent No.: US 9,658,648 B2
(45) Date of Patent: May 23, 2017

(54) FLEXIBLE PRINTED CIRCUIT CABLES WITH SERVICE LOOPS AND OVERBENDING PREVENTION

(71) Applicant: Apple Inc., Cupertino, CA (US)

(72) Inventors: Benjamin M. Rappoport, Los Gatos, CA (US); Justin R. Wodrich, Saratoga, CA (US); Santhana Balaji, Cupertino, CA (US); Shayan Malek, San Jose, CA (US)

(73) Assignee: Apple Inc., Cupertino, CA (US)

( * ) Notice: Subject to any disclaimer, the term of this patent is extended or adjusted under 35 U.S.C. 154(b) by 379 days.

(21) Appl. No.: 14/224,892

(22) Filed: Mar. 25, 2014

(65) Prior Publication Data

US 2015/0070840 A1    Mar. 12, 2015

Related U.S. Application Data

(60) Provisional application No. 61/874,802, filed on Sep. 6, 2013.

(51) Int. Cl.
*G06F 1/16* (2006.01)
*H05K 1/02* (2006.01)
*H05K 3/00* (2006.01)

(52) U.S. Cl.
CPC ......... *G06F 1/1633* (2013.01); *H05K 1/0281* (2013.01); *H05K 3/0064* (2013.01); *H05K 2201/09109* (2013.01); *H05K 2201/2009* (2013.01)

(58) Field of Classification Search
USPC .................. 361/789, 679.56, 749; 174/254
See application file for complete search history.

(56) References Cited

U.S. PATENT DOCUMENTS

| | | | |
|---|---|---|---|
| 6,271,477 B1 | 8/2001 | Carroll et al. | |
| 6,483,037 B1 * | 11/2002 | Moore | H05K 1/0278 174/254 |
| 7,643,305 B2 | 1/2010 | Lin | |
| 8,712,233 B2 | 4/2014 | Gibbs et al. | |
| 2002/0014518 A1 * | 2/2002 | Totani | H05K 3/363 228/180.1 |
| 2002/0046868 A1 * | 4/2002 | Borg | G06F 1/1616 174/113 R |

(Continued)

*Primary Examiner* — Andargie M Aychillhum
(74) *Attorney, Agent, or Firm* — Treyz Law Group, P.C.; G. Victor Treyz; Joseph F. Guihan

(57) ABSTRACT

An electronic device may have a signal cable formed from a flexible printed circuit. A service loop may be formed in the signal cable. The bend may be formed in a desired location on the flexible printed circuit by contraction of an elastic member having ends attached to the flexible printed circuit. The elastic member may be conductive to carry signals and provide shielding. Structures may be attached to the flexible printed circuit to promote bending in a desired location and direction. A crease or other bending promotion feature may be applied to the flexible printed circuit at a desired bend location. Overbending prevention structures such as overmolded elastomeric structures may be applied to the flexible printed circuit at the bend. Integral strain relief features may prevent overbending of the flexible printed circuit upon exiting the elastomeric structures. Overmolded structures may serve as protective bumpers.

20 Claims, 18 Drawing Sheets

(56) References Cited

U.S. PATENT DOCUMENTS

| | | | |
|---|---|---|---|
| 2009/0286186 A1* | 11/2009 | Kondoh | G06F 3/045 430/313 |
| 2010/0060529 A1* | 3/2010 | Schlub | H01Q 1/243 343/702 |
| 2013/0289688 A1 | 10/2013 | Greenberg et al. | |
| 2014/0073196 A1* | 3/2014 | Hashim | H01R 24/00 439/676 |
| 2014/0078692 A1 | 3/2014 | Park et al. | |

* cited by examiner

FLEXIBLE PRINTED CIRCUIT CABLES WITH SERVICE LOOPS AND OVERBENDING PREVENTION

This application claims priority to U.S. provisional patent application No. 61/874,802 filed Sep. 6, 2013, which is hereby incorporated by reference herein in its entirety.

BACKGROUND

This relates generally to printed circuits and, more particularly, to structures used within electronic devices for guiding and protecting printed circuits such as flexible printed circuits.

Electronic devices such as computers, cellular telephones, and other electronic devices often include printed circuits. Electrical components such as integrated circuits and other electronic devices can be interconnected using signal traces on printed circuits. Rigid printed circuit boards are planar. Flexible printed circuits can be bent and can serve as signal cables for interconnecting components in different portions of a device.

Challenges arise when routing flexible printed circuits within an electronic device. If a flexible printed circuit is bent too abruptly, the signal traces on the flexible printed circuit can become damaged. Flexible printed circuits may also be susceptible to damage from contact with sharp structures such as the exposed edges of rigid printed circuit boards. Service loops may need to be included in flexible printed circuits to facilitate device assembly and disassembly. If care is not taken, electronic devices with flexible printed circuits may be unreliable and difficult to manufacture.

It would therefore be desirable to be able to provide improved structures for controlling the bending and routing of flexible printed circuits in electronic devices.

SUMMARY

An electronic device may be provided with electrical components that are interconnected using printed circuits. The printed circuits may include rigid printed circuit boards and flexible printed circuits. The flexible printed circuits may include signal lines such as metal traces that carry signals such as power and data signals that allow the flexible printed circuits to serve as signal cables. When assembled in an electronic device, a signal cable may be coupled between electrical components such as touch sensors, displays, printed circuits, audio components, antennas, and other components. A service loop may be formed in the signal cable to facilitate assembly and disassembly operations.

The formation of the service loop in a flexible printed circuit cable may be controlled using bend promotion features and an elastic member. Structures such as plastic members may be attached to the surfaces of the flexible printed circuit to serve as bending promotion features that encourage bending at a desired location. Creases or other bending promotion features may also be formed within the polymer substrate of the flexible printed circuit. The elastic member may have ends attached to opposing sides of a bend in the flexible printed circuit. The bend may be formed by contraction of the elastic member. The elastic member may be conductive to carry signals and provide shielding.

Overbending prevention structures such as overmolded elastomeric structures may be applied to the flexible printed circuit at a bend. The overbending prevention structures may prevent the flexible printed circuit from being bent more abruptly than desired. Integral strain relief features may prevent overbending of the flexible printed circuit upon exiting the elastomeric structures. Metal structures and other structures may be included in the overbending prevention structures. Overmolded elastomeric structures may have recesses that receive sharp objects such as the edges of printed circuit boards so that the overmolded elastomeric structures can serve as protective bumpers for the flexible printed circuits.

DETAILED DESCRIPTION

An electronic device may be provided with electronic components that are interconnected by signal lines formed from conductive traces on printed circuits. The printed circuits may include rigid printed circuit boards formed from materials such as fiberglass-filled epoxy and flexible printed circuits formed from sheets of polyimide or other flexible polymer layers. The conductive traces may be formed from patterned metal layers. Signal buses and other signal paths may be formed from patterned metal lines on the printed circuits. For example, flexible printed circuit cables may include sets of parallel signal lines that form buses for conveying signals between components.

Overbending prevention structures may be used to prevent flexible printed circuits from bending more than a desired amount. Bumper structures may be used to prevent rubbing between flexible printed circuits and sharp objects such as the edges of printed circuit boards. An elastic member may be used to help bend a flexible printed circuit at a desired location to form a service loop.

Figure 1:
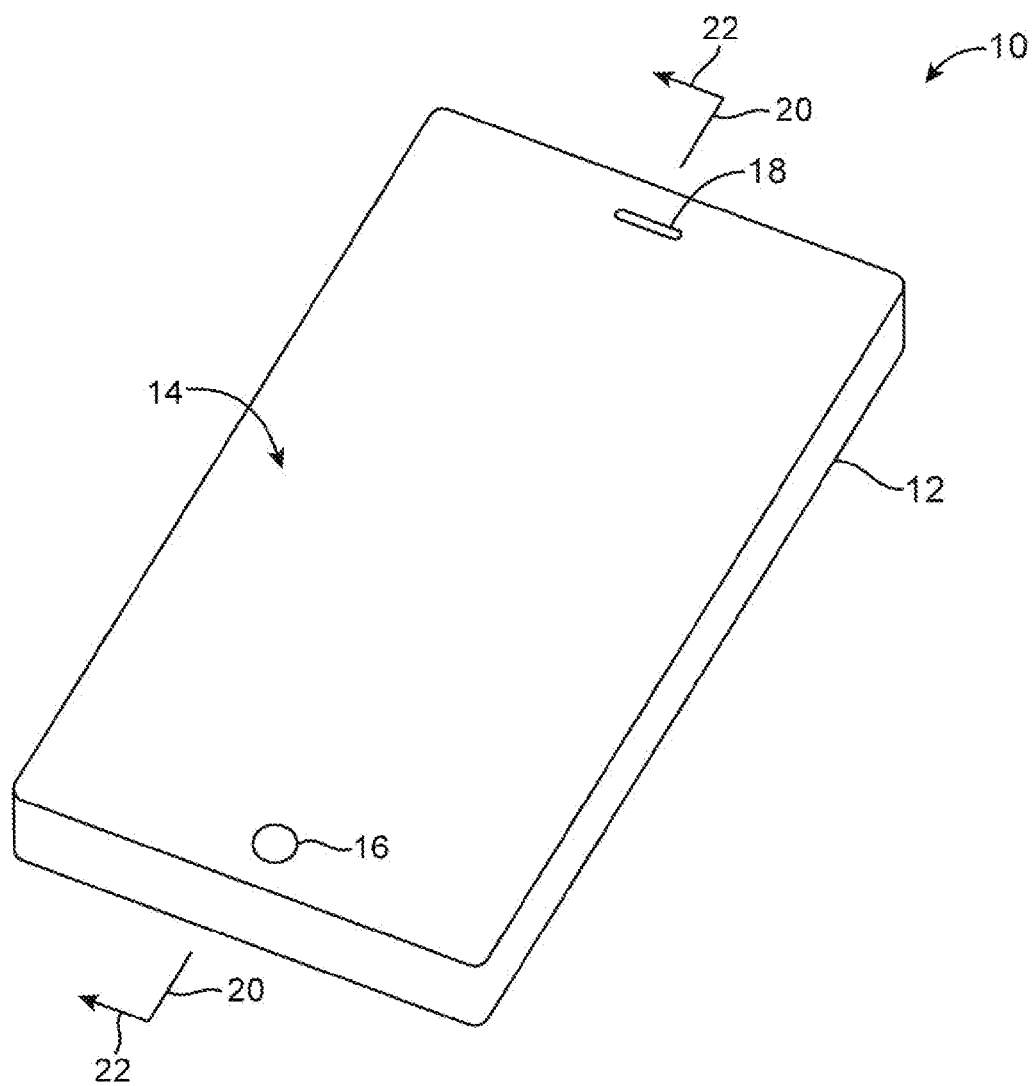
FIG. 1 is a perspective view of an illustrative electronic device such as a handheld computing device or other electronic device that may be provided with flexible printed circuits and flexible printed circuit guiding structures in accordance with an embodiment.

An illustrative electronic device of the type that may be provided with printed circuits is shown in FIG. 1. Device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, a router, a set-top box, equipment that implements the functionality of two or more of these devices, or other electronic equipment. In the illustrative configuration of FIG. 1, device 10 is a portable device such as a cellular telephone, media player, tablet computer, or other portable computing device.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 may include display pixels that are formed from liquid crystal display (LCD) components, organic light-emitting diode components, electrophoretic display components, or other suitable display pixel structures.

A display cover layer may cover the surface of display 14 or a display layer such as a color filter layer (e.g., a layer formed from a clear substrate covered with patterned color filter elements) or other portion of a display may be used as the outermost (or nearly outermost) layer in display 14. The outermost display layer may be formed from a transparent glass sheet, a clear plastic layer, or other transparent member. If desired, openings may be formed in the outermost layer of display 14 to accommodate components such as button 16 and speaker port 18 of FIG. 1 (as examples). Buttons, connector ports, and other structures may also be accommodated using openings in housing 12.

Figure 2:
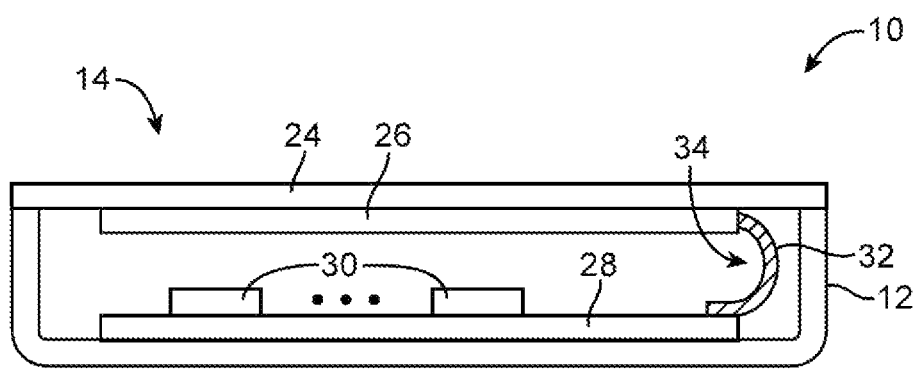
FIG. 2 is a cross-sectional side view of an electronic device of the type that may be provided with a flexible printed circuits and flexible printed circuit guiding structures in accordance with an embodiment.

FIG. 2 is a cross-sectional side view of electronic device 10 of FIG. 1 taken along line 20 and viewed in direction 22 of FIG. 1. As shown in FIG. 2, display 14 may be mounted in electronic device housing 12. Display 14 may include display cover layer 24 (e.g. a sheet of clear glass or plastic)

and display layers 26. Display layers 26 may be associated with a liquid crystal display and may include structures such as a thin-film transistor layer, color filter layer, a layer of liquid crystal material, polarizer layers, and backlight structures. Other types of display may be used in forming display 14 if desired.

One or more printed circuits such as printed circuit 28 and printed circuit 32 may be used to mount and interconnect electronic components in device 10. Printed circuit 28 may be, for example, a rigid printed circuit board. Components 30 may be mounted to printed circuit 28 using solder or conductive adhesive. Components 30 may include integrated circuits, discrete components such as resistors, capacitors, and inductors, switches, sensors, connectors, audio components, etc. Printed circuit 32 may be a flexible printed circuit having one or more bends such as bend 34. In the example of FIG. 2, flexible printed circuit 32 is being used to couple components 30 on printed circuit 28 to display 14 (e.g., to convey signals from components 30 to display driver circuitry on a thin-film transistor layer in a liquid crystal display or other display structure). This is merely illustrative. The components that are being coupled together using flexible printed circuit 32 may include any combination of: a display, a sensor, a touch sensor, a button, an antenna, a fingerprint sensor, a proximity sensor, an ambient light sensor, a capacitive touch sensor, integrated circuits on a printed circuit (i.e., a printed circuit board), a data port, a motherboard, audio components such as a speaker and/or microphone, light-emitting diodes for a status indicator component, or other electronic components.

Figure 3:
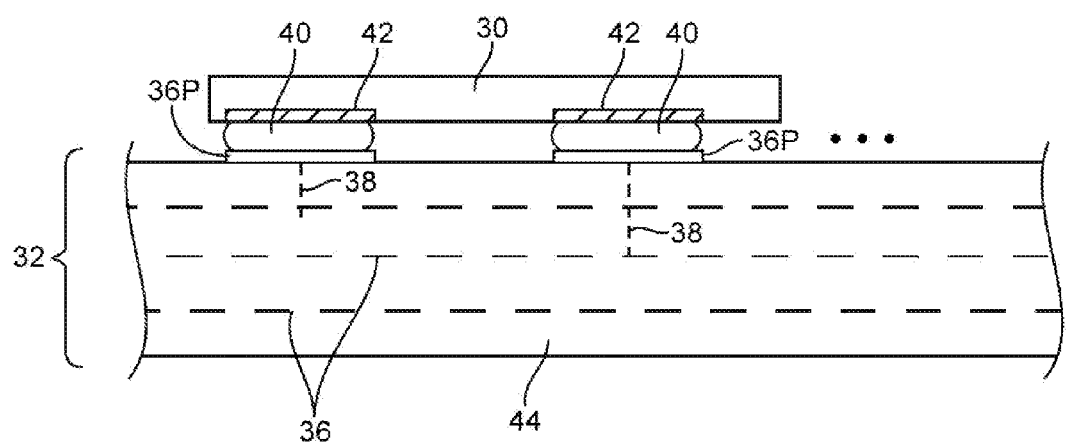
FIG. 3 is a cross-sectional side view of a flexible printed circuit in accordance with an embodiment.

A cross-sectional side view of a portion of a flexible printed circuit is shown in FIG. 3. As shown in FIG. 3, flexible printed circuit 32 may include layers of patterned metal traces 36 separated by respective layers of dielectric 44. Dielectric 44 may be polyimide or other flexible polymer material. The layers of patterned metal traces and layers of dielectric may be sandwiched together to form flexible printed circuit 32. Metal interconnect structures such as vias 38 may be used to interconnect horizontally extending metal traces 36. The material that is used to form the conductive traces in printed circuit 32 (e.g., the patterned metal signal lines in layers 36 and vias 38) may be copper, gold, aluminum, molybdenum, other metals and metal alloys, non-metallic conductive materials, or other suitable conductors. As shown in FIG. 3, components such as component 30 may be mounted to flexible printed circuit 32 using conductive material 40. Conductive material 40 may be solder, conductive adhesive, or other conductive material. Conductive material 40 may be used to electrically and mechanically connect contacts 42 of component 30 to metal traces such as contact pads 36P in the uppermost metal layer on flexible printed circuit 32. Component 30 may be a connector (e.g., a board-to-board connector or other connector), an integrated circuit, a sensor, a display structure, an antenna, a touch sensor, etc.

In the example of FIG. 2, printed circuit 32 has been provided with a single bend (bend 34). If desired, printed circuit 32 may have multiple bends that form a service loop. A service loop in a flexible printed circuit creates slack in the flexible printed circuit that helps accommodate movement of components 30 during assembly and disassembly operations. As an example, inclusion of a service loop in a portion of a flexible printed circuit that extends between a logic board and display allows the display to be moved relative to the logic board when mounting the display within the housing of a device during device assembly operations. The service loop also allows the display to be move relative to the device housing for rework or repair. A service loop generally includes two or more bends. For example, a service loop may include two outwardly extending bends separated by one inwardly protruding bend.

Figure 4:
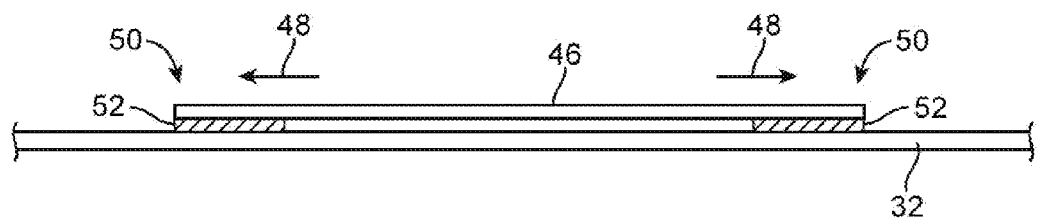
FIG. 4 is a cross-sectional side view of a flexible printed circuit with elastic structures for helping to form a service loop in the flexible printed circuit in an electronic device in accordance with an embodiment.

FIG. 4 is a cross-sectional side view of an illustrative flexible printed circuit that has been provided with an elastic structure to help form the flexible printed circuit into a desired service loop shape. As shown in FIG. 4, elastic member 46 may be stretched outwards before attachment to flexible printed circuit 32. In particular, ends 50 of elastic member 46 may be stretched outwards in directions 48. Once elastic member 46 has been stretched, ends 50 of elastic member may be attached to flexible printed circuit 32 using connections 52. Connections 52 may be formed by fusing elastic member 46 to flexible printed circuit 32 using heat (e.g., heat applied using a radio-frequency welder, heat applied using a hot bar, heat applied using a laser, etc.), by coupling elastic member 46 to flexible printed circuit 32 using adhesive, or using other coupling structures. If desired, ends 50 may be attached to flexible printed circuit 32 at the locations shown in FIG. 4 by bending flexible printed circuit 32 to bring desired portions of flexible printed circuit 32 under ends 50 instead of stretching member 46 (or while stretching member 46). The configuration of FIG. 4 in which member 46 is stretched without bending flexible printed circuit 32 during formation of connections 52 is merely illustrative.

Elastic member 46 may be formed from an elastomeric polymer, elastomeric polymer fibers, a strip of elastomeric material (e.g., a strip of elastomeric tape), conductive fibers interwoven with elastomeric fibers, elastomeric fibers coated with metal or other conductive materials, corrugated sheet metal springs or corrugated plastic springs, metal or plastic springs with other shapes, or other resilient structures that tend to return to an initial shorter length after being stretched outward to a longer length. In configurations in which flexible printed circuit 32 is provided with an elastic structures such as elastic member 46 formed from conductive materials, the elastic structure may serve as a grounding structure, a signal path for analog and/or digital signals, radio-frequency shielding, or other electromagnetic shielding or signal paths.

When flexible printed circuit 32 of FIG. 4 is assembled into an electronic device, elastic member 46 can stretch, allowing full use of the slack provided by the service loop in flexible printed circuit 32. When the components being assembled are in their final position, elastic member 46 can contract towards its original unstretched length.

Figure 5:
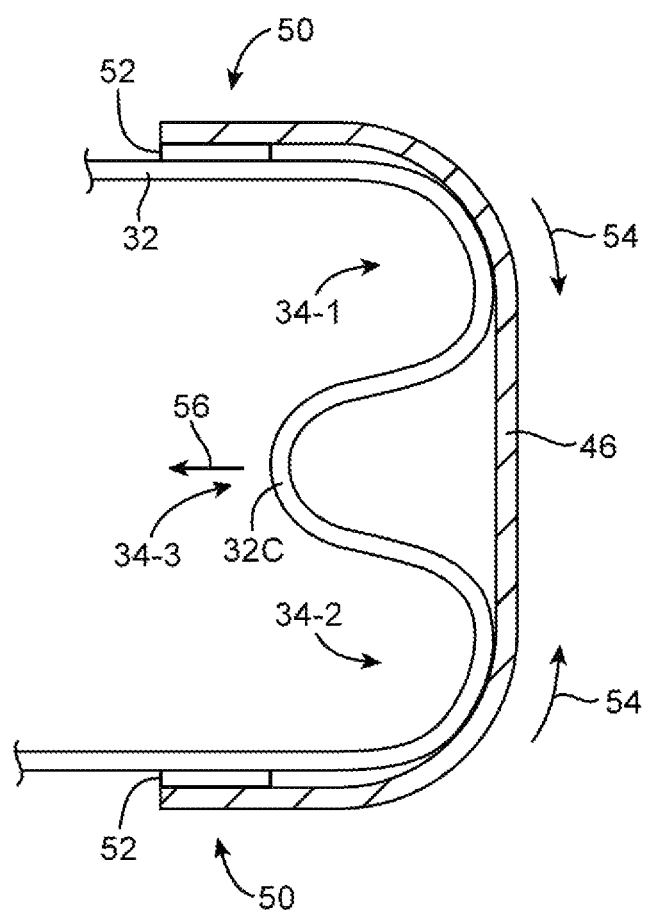
FIG. 5 is a cross-sectional side view of a flexible signal cable formed from a flexible printed circuit of the type shown in FIG. 4 in which the elastic structures have contracted to form a service loop in the flexible printed circuit in accordance with an embodiment.

When elastic member 46 contracts, a service loop is created with a predefined shape at a predefined location along the length of flexible printed circuit 32. FIG. 5 is a cross-sectional side view of a signal cable formed from flexible printed circuit 32 of FIG. 4 following mounting of flexible printed circuit 32 within electronic device 10. Elastic member 46 is resilient and therefore tends to contract once released from its stretched configuration. This causes ends 50 to be pulled inwardly towards each other in directions 54, as shown in FIG. 5. Flexible printed circuit 32 is coupled to ends 50 of elastic member by connections 52 at ends 50. As a result of the contraction of ends 50 in directions 54, central portion 32C of flexible printed circuit 32 is forced inwardly in direction 56, forming inwardly protruding bend 34-3 between respective outwardly protruding bends 34-1 and 34-2. Ends 50 are located on opposing sides of bend 34-3. Because the direction in which bend 34-3 is formed is defined by the location of elastic member 46, it is not necessary for a technician or machine to press inwardly on flexible printed circuit 32 to ensure correct service loop formation. Rather, the restoring force produced by stretched elastic member 46 as stretched elastic member 46 relaxes from its stretched configuration helps to move flexible printed circuit 32 into a satisfactory service loop shape such as the shape of the service loop of FIG. 5.

Figure 6:
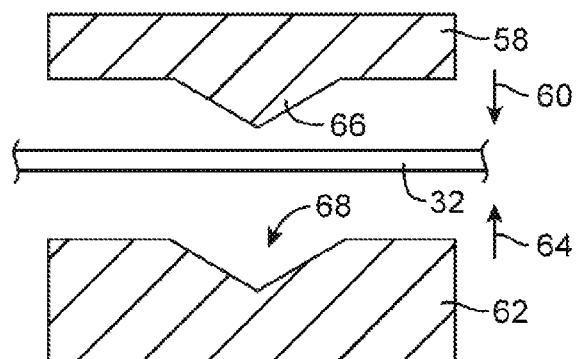
FIG. 6 is a cross-sectional side view of a tool such as a heated die that can be used to create a crease or other local feature that serves as a bending promotion feature defining a preferred bending location on a flexible printed circuit in an electronic device in accordance with an embodiment.
Figure 7A:
FIG. 7A is a cross-sectional side view of a flexible printed circuit that has been locally deformed to form a crease at a desired bending location using a tool of the type shown in FIG. 6 in accordance with an embodiment.

To help promote formation of flexible printed circuit bends at desired locations, flexible printed circuit 32 may be locally processed to form a crease (e.g., an indentation or otherwise locally weakened line across printed circuit 32) or other bending promotion feature at a particular position on flexible printed circuit. Local processing of flexible printed circuit 32 in this way may be accomplished using a laser, a heated die, a cutting tool, a hot bar, a lamp, or other equipment. As shown in FIG. 6, for example, flexible printed circuit 32 may be compressed between mating heated die. During localized processing, upper die 58 may be moved downwards towards flexible printed circuit 32 in direction 60 and lower die 62 may be moved upwards towards flexible printed circuit 32 in direction 64. Die 58 may have a protrusion such as protrusion 66. Die 62 may have a recess such as recess 68 that receives protrusion 66. Following compression between upper die 58 and lower die 62, flexible printed circuit 32 may have a crease or other locally weakened and/or processed feature such as illustrative bend promotion feature (crease) 70 of FIG. 7A.

Figure 7B:
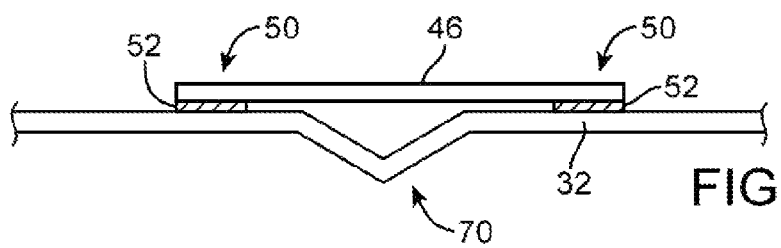
FIG. 7B is a cross-sectional side view of the flexible printed circuit of FIG. 7A following attachment of a resilient biasing structure in accordance with an embodiment.
Figure 8:
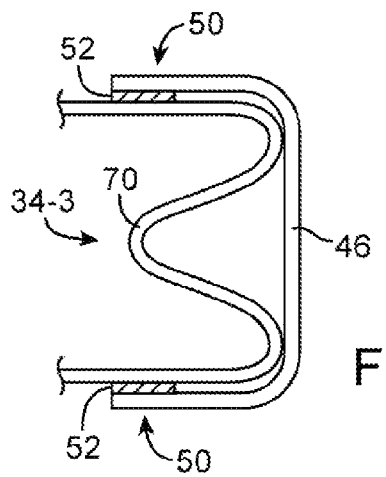
FIG. 8 is a cross-sectional side view of a flexible printed circuit with a service loop that has been formed in the flexible printed circuit of FIG. 7B at the desired bending location in accordance with an embodiment.

FIG. 7B shows how flexible printed circuit 32 may appear following attachment of stretched elastic member 46 to flexible printed circuit 32. Ends 50 of stretched elastic member 46 may be attached to flexible printed circuit 32 using connections 52. Elastic member 46 may overlap bend promotion feature 70. Because elastic member 46 covers localized bend promotion feature 70, feature 70 may define a particular location along the length of flexible printed circuit 32 at which service loop bend 34-3 will be formed when elastic member 46 contracts and the service loop is formed in flexible printed circuit 32 as shown in FIG. 8.

Figure 9:
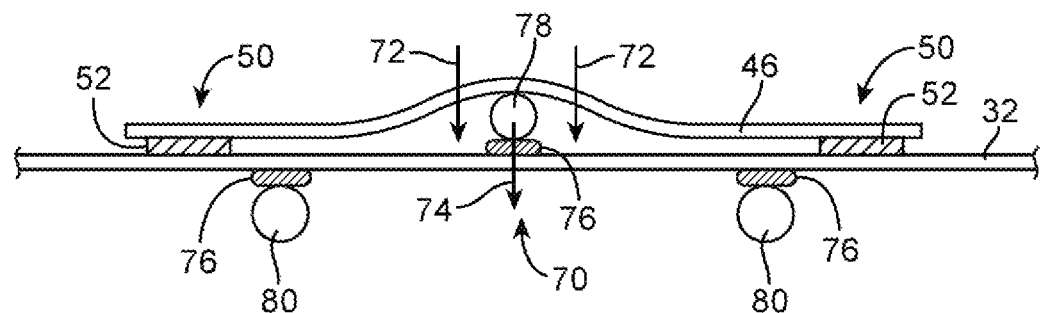
FIG. 9 is a cross-sectional side view of a flexible printed circuit that has been provided with an elastic member for bending the flexible printed circuit and structures that help define a desired service loop shape for the flexible printed circuit when the flexible printed circuit is bent in accordance with an embodiment.

If desired, structures may be attached to flexible printed circuit 32 to help ensure that flexible printed circuit 32 bends into a desired service loop shape. This type of arrangement is shown the cross-sectional side view of flexible printed circuit 32 of FIG. 9. As shown in FIG. 9, structures such as structures 78 and 80 may be attached to flexible printed circuit 32 using connections 76. Structures 78 and 80 may have the shape of rods (e.g., cylindrical rods having circular cross sections as shown in the example of FIG. 9), may have the shape of strips of material, or may have other suitable shapes. Materials such as plastic, metal, glass, and other materials may be used in forming structures 78 and 80. Connections 76 may be formed by fusing structures 78 and/or 80 to flexible printed circuit 32 using heat, may be based on adhesive that attaches structures 78 and 80 to flexible printed circuit 32, may be formed from interlocking features, or may be formed from other structures that attach members 78 and 80 to flexible printed circuit 32.

Figure 10:
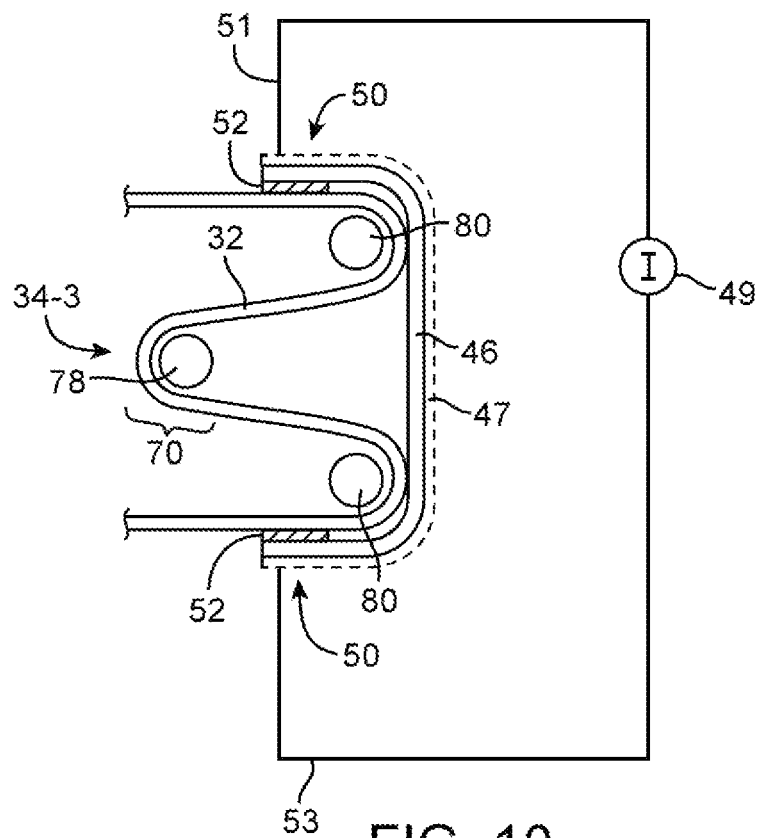
FIG. 10 is a cross-sectional side view of the flexible printed circuit of FIG. 9 following bending into a desired service loop shape by contraction of an elastic member that has ends coupled to the flexible printed circuit on opposing sides of a bend in accordance with an embodiment.

The locations at which structures 78 and 80 are attached to flexible printed circuit 32 may be selected to encourage the formation of bends that protrude in desired directions. For example, structure 78 may be mounted to the upper (outer) surface of flexible printed circuit 32 and structures 80 may be mounted on opposite sides of structure 78 on the opposing lower (inner) surface of flexible printed circuit 32. Ends 50 of stretched elastic member 46 may be attached to flexible printed circuit 32 with connections 52 so that member 46 overlaps structure 78 on the outer surface of flexible printed circuit 32. Member 46 is under tension and will therefore press downwards in directions 72 on structure 78. This, in turn, will press structure 78 downward in direction 74. As shown in FIG. 10, this will cause bend 34-3 to bow inwardly on the side of flexible printed circuit 32 opposing structure 78. The presence of structure 78 serves to promote bending of flexible printed circuit 32 in a known direction (i.e. inwardly) at a desired location to form bend 34-3 for a service loop (i.e., structures such as structure 78 may serve as bending promotion structures).

If desired, one or more layers of material that change shape when signals are applied may be used in compressing the service loop to assist in assembly. For example, a layer of material such as layer 47 of FIG. 10 (e.g., an electroactive polymer structure or a shape memory alloy structure) may be formed on top of layer 46 or may be used instead of layer 46. A signal source such as a current or voltage source (e.g. source 49 of FIG. 10) may apply a signal (e.g., a current or voltage signal) to layer 47 during assembly to change the shape of layer 47 (e.g., to shrink layer 47 and thereby help press structure 78 downwards to form bend 34-3. After the desired shape change has been activated by application of the signal to layer 47 (e.g., a signal that causes a member attached to flexible printed circuit 32 such as layer 47 to contract), flexible printed circuit 32 may remain nested in its desired position (e.g., the position of FIG. 10) by structures 78 and 80 or by other supporting structures in device 10.

Figure 11:
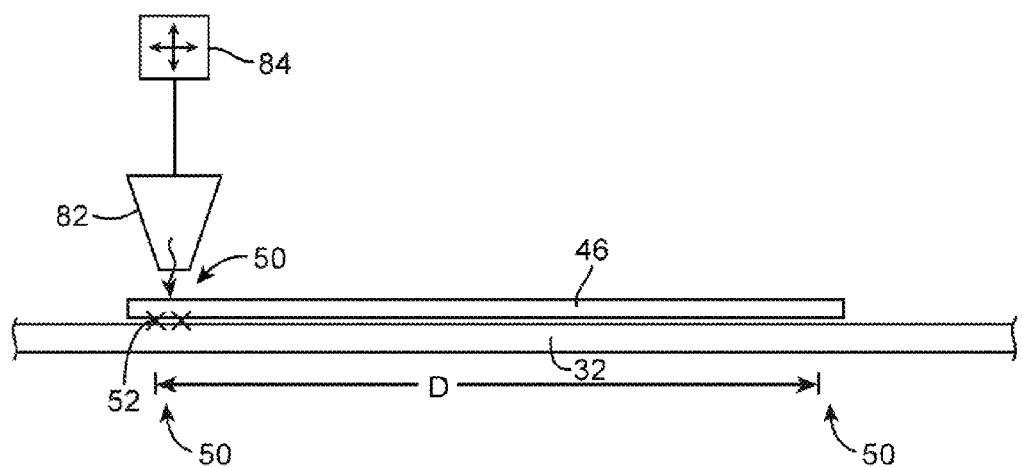
FIG. 11 is a cross-sectional side view of a flexible printed circuit showing equipment that may be used in attaching an elastic member to two or more locations along the length of the flexible printed circuit in accordance with an embodiment.

FIG. 11 is a cross-sectional side view of an illustrative system for forming connections 52 between stretched elastic member 46 and flexible printed circuit 32. In the example of FIG. 11, computer-controlled positioner 84 is being used to position tool head 82 at a desired location relative to elastic member 46 and flexible printed circuit 32. Tool head 82 may be a radio-frequency welding head, a hot bar for applying heat, an ultrasonic welding head, a riveting head, an adhesive application head such as a needle dispenser or spray dispenser, or other equipment for forming connections 52. During operation, elastic member 46 may be stretched outward and/or flexible printed circuit 32 may be bent while the equipment of FIG. 11 is used to form connections 52 at locations along the length of flexible printed circuit 32 that are separated by a desired distance D. For example, heat may be applied to form fused plastic connections between the polymer of member 46 and the polymer of flexible printed circuit 32 or adhesive may be used in joining member 46 and flexible printed circuit 32. Flexible printed circuit 32 can then be installed in a system. When installed, elastic member 46 will contract to help place flexible printed circuit 32 in a desired service loop configuration.

Figure 12:
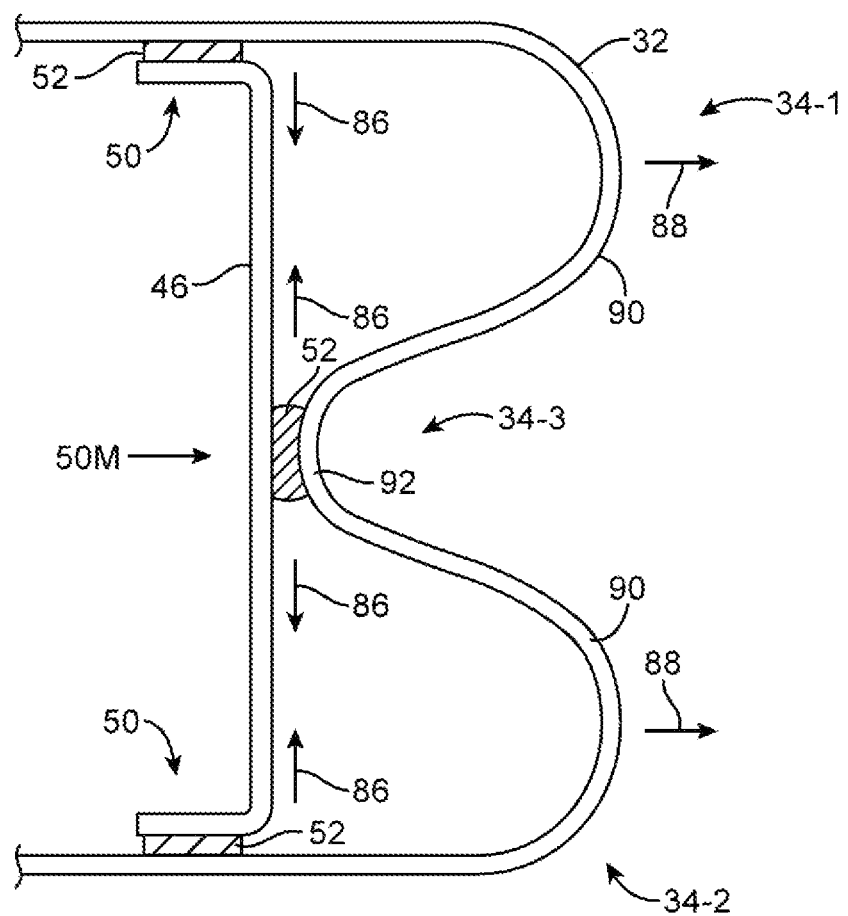
FIG. 12 is a cross-sectional side view of a flexible printed circuit that has been pulled into a desired service loop shape by an elastic member formed on an inner bend surface of the flexible printed circuit in accordance with an embodiment.

If desired, elastic member 46 may be attached to the inner bend surface of flexible printed circuit 32, as shown in FIG. 12. Elastic member 46 may be attached to flexible printed circuit 32 using connections 52 at respective ends of elastic member 46. Elastic member 46 may also be attached to flexible printed circuit 32 using a connection 52 at an intermediate location along the length of flexible printed circuit 32 such as location 50M (i.e., a location that is midway between ends 50). When elastic member 46 contracts in directions 86, portions 90 on the outer surface of flexible printed circuit 32 will tend to bow outward in directions 88, thereby forming outward service loop bends 34-1 and 34-2. Portion 92 of flexible printed circuit 32 will tend to bow inwardly to form inward service loop bend 34-3.

Figure 13:
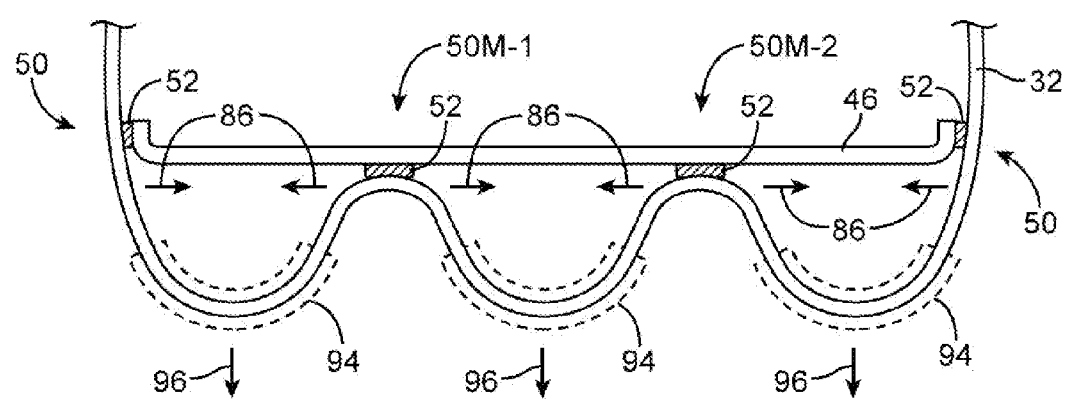
FIG. 13 is a cross-sectional side view of a flexible printed circuit service loop with a plurality of bends that has been formed using an elastic member that has pulled the flexible printed circuit inwardly at two points along the length of the flexible printed circuit in accordance with an embodiment.

In the illustrative example of FIG. 13, elastic member 46 has been attached to flexible printed circuit 32 using connections 52 that are located at opposing ends 50 of elastic member 46. Elastic member 46 has also been attached to flexible printed circuit 32 using connections 52 at two intermediate locations between ends 50 (i.e. intermediate locations 50M-1 and 50M-2). When elastic member 46 contracts in directions 86, flexible printed circuit 32 will move outwardly in direction 96 at three locations along the length of flexible printed circuit 32, thereby forming a service loop with three outward bends. This type of arrangement may, in general, be used in forming service loops with any suitable number of flexible printed circuit bends. The formation of three outwardly protruding bends in the illustrative service loop of FIG. 13 is merely an example.

Structures 94 of FIG. 13 may be provided on flexible printed circuit 32 to help maintain a minimum desired bend radius for flexible printed circuit 32 at one or more of the bends in flexible printed circuit 32. Structures 94 may be formed from overmolded elastomeric material or other suitable material (e.g., plastic metal, etc.). The overmolded elastomeric material of each structure 94 may be molded onto flexible printed circuit 32 when flexible printed circuit 32 is bent (i.e., each structure 94 may be overmolded over a bend in flexible printed circuit 32 so that the overmolded structure covers the bend). Further bending (i.e. additional bending that might reduce the bend radius of the flexible printed circuit at each bend) may be prevented by the presence of the structure 94 overlapping the bend. Structures such as optional elastomeric structures 94 of FIG. 13 may sometimes be referred to as flexible printed circuit guiding structures or overbending prevention structures. If desired, overbending prevention structures may be configured to serve as printed circuit bumpers or other protective bumper structures, may include metal, or may be formed in other shapes and/or using other materials.

Figure 14:
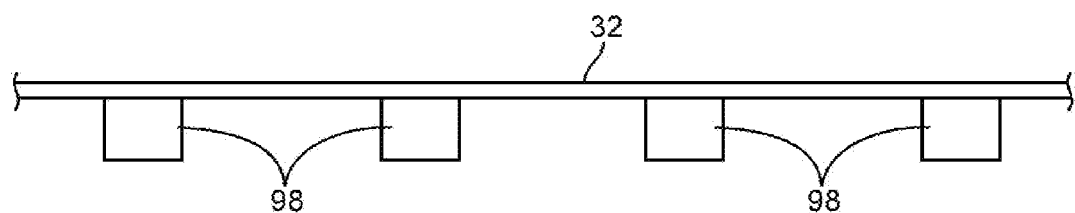
FIG. 14 is a cross-sectional side view of a flexible printed circuit with overbending protection spacer structures to prevent over-bending of the flexible printed circuit when forming a service loop in the flexible printed circuit in accordance with an embodiment.
Figure 15:
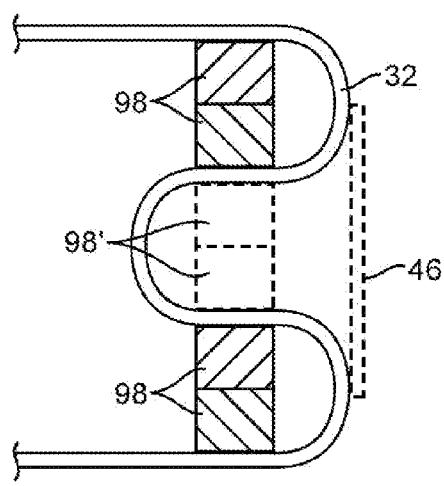
FIG. 15 is a cross-sectional side view of the flexible printed circuit and spacer structures of FIG. 14 when formed into the shape of a service loop in accordance with an embodiment.

FIG. 14 is a side view of flexible printed circuit 32 showing how an overbending prevention structure may be formed from spacers that are attached to flexible printed circuit 32. Spacers 98 may be formed from plastic, metal, glass, magnetic material or other structures. Spacers 98 may be attached to flexible printed circuit 32 using adhesive, welds, or other suitable connections. When flexible printed circuit 32 is bent into a service loop shape of the type shown in FIG. 15, the presence of spacers 98 may prevent the bends in the flexible printed circuit material from being more abrupt than a desired amount (i.e., spacers 98 may ensure that the bends in flexible printed circuit 32 are characterized by a bend radius that is more than a minimum bend radius). Any suitable number of spacers 98 may be provided on flexible printed circuit 32. For example, a minimum bend radius may be ensured for a single bend in a flexible printed circuit using a single pair of mating spacers 98. In the example of FIG. 15, two pairs of spacers 98 are being used to ensure that each of two bends is provided with a desired minimum bend radius. An additional pair of spacers 98 may be provided where shown by dashed lines 98' in arrangements in which it is desired to ensure a minimum bend radius for each of the three bends in the service loop. More or fewer spacers may be used in different usage scenarios.

If desired, spacers 98 may be magnetic (i.e. spacers 98 may be formed from magnets and/or ferromagnetic material such as iron). In this situation, opposite magnetic poles may be provided to spacers that are intended to attract each other whereas common magnetic poles may be arranged to face each other in scenarios in which it is desired for the magnets to repel each other and thereby ensure that a desired minimum bend radius is maintained. Optional elastic member 46 may be attached to flexible printed circuit 32 to help form the service loop of FIG. 15.

Figure 16:
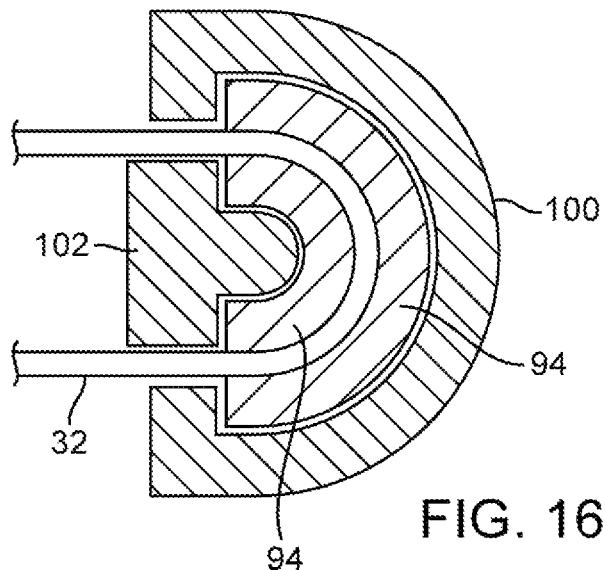
FIG. 16 is a cross-sectional side view of molding equipment being used to mold overbending prevention structures over a flexible printed circuit in accordance with an embodiment.
Figure 17:
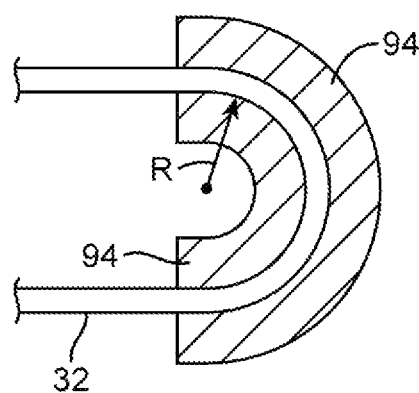
FIG. 17 is a cross-sectional side view of the flexible printed circuit of FIG. 16 following removal of the molding equipment in accordance with an embodiment.

Overbending prevention structures may be formed from overmolded plastic material. As an example, a heated plastic injection molding die may be used to overmold elastomeric material around a portion of flexible printed circuit 32 as shown in FIG. 16. In the example of FIG. 16, elastomeric structure 94 may be formed using a mold formed from die 100 and die 102. The elastomer using in forming structure 94 may be a unitary injection molded structure or multiple parts may be joined using fasteners or other attachment mechanisms. Following removal of the plastic injection molding die, overbending prevention structure 94 may be used to prevent flexible printed circuit 32 from being bent more abruptly than would be associated with a predetermined minimum bend radius R, as shown in FIG. 17. The elastomeric material used for forming an injection molded overbending prevention structure may be a thermoplastic material, a thermoset material or other suitable polymer. As an example, the elastomeric material used in forming the overbending prevention structure may be a thermoplastic elastomer such as thermoplastic silicone.

Figure 18:
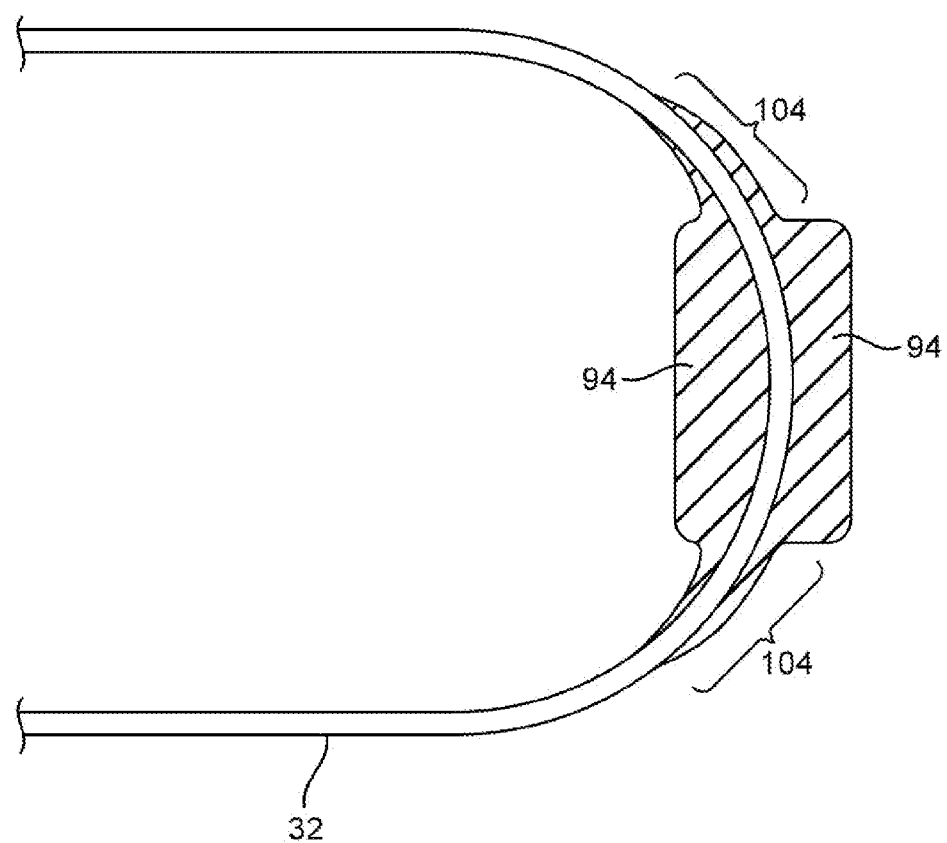
FIG. 18 is a cross-sectional side view of a flexible printed circuit with an overmolded guide structure having integral strain relief structures to prevent damage to the flexible printed circuit where the flexible printed circuit exits the overmolded guide structure in accordance with an embodiment.

FIG. 18 shows how overbending prevention structure 94 may be overmolded over flexible printed circuit 32 in a shape that includes integral strain relief structures 104. Strain relief structures 104 may be narrower than the rest of structure 94 (i.e. structures 104 may be tapered so that they have smaller lateral dimensions perpendicular to the surface of flexible printed circuit 32 than other portions of overbending prevention structure 94). The local narrowing of strain relief structures 104 allows strain relief structures 104 to bend when stressed by flexible printed circuit 32. Because strain relief structures 104 tend to bend when pulled by flexible printed circuit 32, structures 104 are less likely to cause flexible printed circuit 32 to bend sharply when exiting overbending prevention structure 94 than overbending prevention structure 94 without integral strain relief structures 104.

Figure 19:
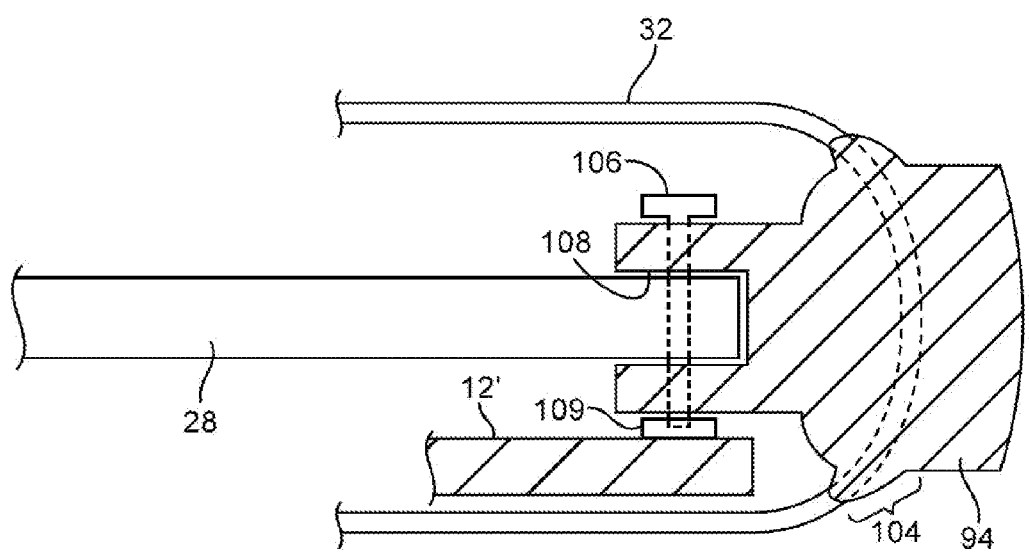
FIG. 19 is a cross-sectional side view of a flexible printed circuit with an overmolded guide structure that serves as a protective bumper for a rigid printed circuit board and that has been attached to a housing structure in an electronic device in accordance with an embodiment.

Overbending prevention structures 94 may be provided with screw holes and other features for facilitating mounting within device 10. As shown in FIG. 19, a fastener such as screw 106 may be used to attach overbending prevention structure 94 to screw boss 109 on housing structure 12' (e.g., an internal housing structure in electronic device 10). Overbending prevention structures 94 may also be provided with recesses such as recess 108. Components that are sharp or that may otherwise present an abrasive and potentially damaging contact point with flexible printed circuit 32 may be covered with an elastomeric structure such as overbending prevention structure 94 to prevent flexible printed circuit 32 from being damaged by contact with these components. In the example of FIG. 19, elastomeric structure 94 is using recess 108 to receive the edge of printed circuit board 28 (e.g., a rigid printed circuit board). In this configuration, elastomeric structure 94 serves as an elastomeric bumper that protects flexible printed circuit 32 from damage due to contact with printed circuit board 28. Bumper structures of this type may be used to protect flexible printed circuit 32 from damage due to contact between flexible printed circuit 32 with other printed circuits, with internal housing structures, from packaged integrated circuits and other electronic devices in housing 12 of device 10, or other structures. The bumper structures may be formed from the same overmolded elastomeric structure that is being used to prevent flexible printed circuit 32 from being bent too much (i.e., overmolded elastomeric structures 94 or other structures may serve both as protective bumper structures and as overbending prevention structures.

Figure 20:
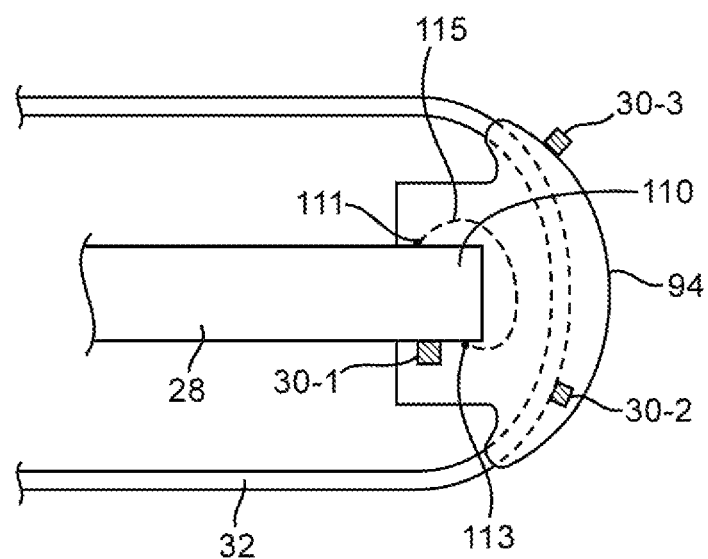
FIG. 20 is a cross-sectional side view of a flexible printed circuit with an overmolded guide structure that has been press fit onto a rigid printed circuit board to serve as a protective bumper for the rigid printed circuit board in an electronic device in accordance with an embodiment.

As shown in FIG. 20, overmolded elastomeric overbending prevention structure 94 may have a recess or other feature that allows structure 94 to be press fit onto edge 110 of printed circuit board 28 or other structure in device 10. In the FIG. 20 configuration, structure 94 serves both as an overbending prevention component that prevents overbending of flexible printed circuit 32 and as a protective bumper that prevents damage due to rubbing between flexible printed circuit 32 and internal device structures such as printed circuit board 28.

If desired, structure 94 may be formed from a conductive elastomer (e.g. an elastomeric material that contains metal particles or other suitable conductive material). When formed from a conductive elastomeric material, structures such as structure 94 may be shaped to serve as an electromagnetic interference shield. As shown in FIG. 20, for example, structure 94 may be configured to cover and electromagnetically shield components on printed circuit 28 such as component 30-1 and/or may be configured to cover and electromagnetically shield components on flexible printed circuit 32 such as component 30-2.

Structure 94 or other elastomeric structures in device 10 may also be formed form a conductive elastomeric material that is patterned to provide electrical paths for signals such as power signals and data signals (see, e.g., illustrative electrical path 115 between node 1 on the upper surface of printed circuit 28 and node 113 on the opposing lower surface of printed circuit 28). Signal paths formed from elastomeric structure 94 may be used to route power and data signals between printed circuits such as printed circuits 28 and 32, between electrical components 30, or between other circuitry in device 10.

Components such as illustrative component 30-3 may also be mounted to a conductive elastomeric material such as structure 94. For example, structure 94 may be patterned to form signal lines for power and/or data signals. Components such as component 30-3 of FIG. 20 may be attached to the signal paths formed from structure 94 using conductive adhesive or other conductive coupling material.

Figure 21:
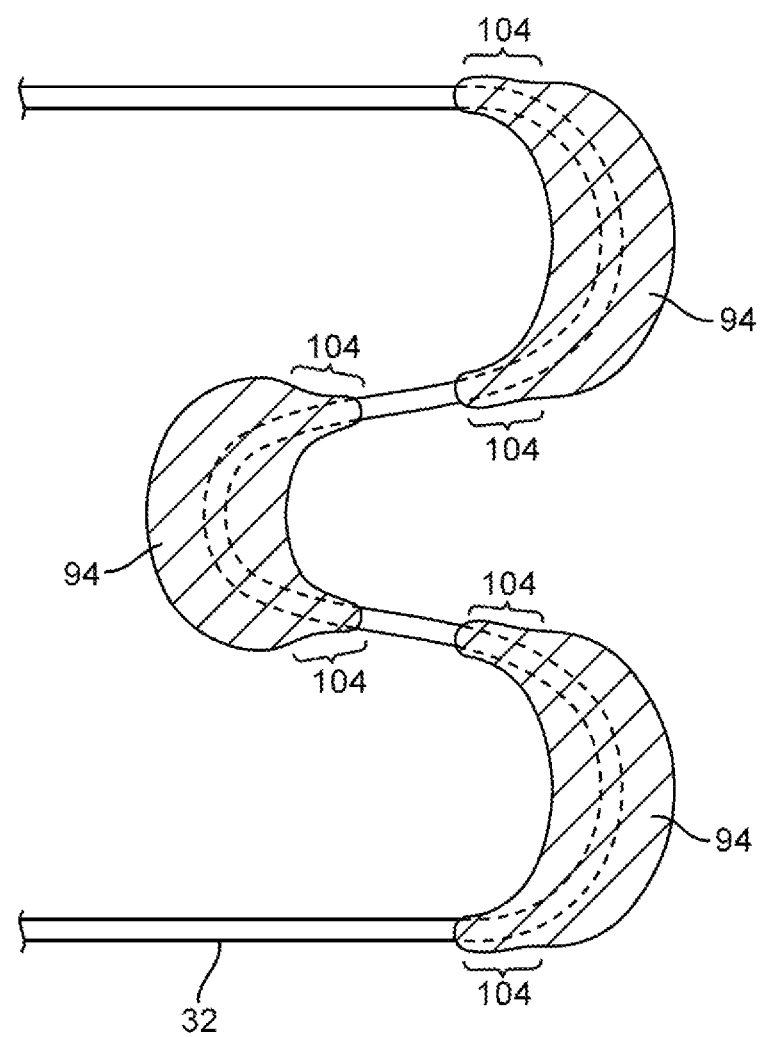
FIG. 21 is a cross-sectional side view of a flexible printed circuit that has been bent into the shape of a desired service loop with the assistance of overmolded elastomeric guide structures having integral strain relief features in accordance with an embodiment.

FIG. 21 shows how overmolded elastomeric structures 94 may be provided at multiple locations along the length of flexible printed circuit 32. The shapes of the bends that are defined by structures 94 and the shapes of strain relief structures 104 helps ensure that flexible printed circuit 32 will form a service loop of a desired shape (e.g., a service loop with two outward bends and one inward bend in the example of FIG. 21). Other service loop arrangements can be created using overmolded elastomeric structures if desired.

Figure 22:
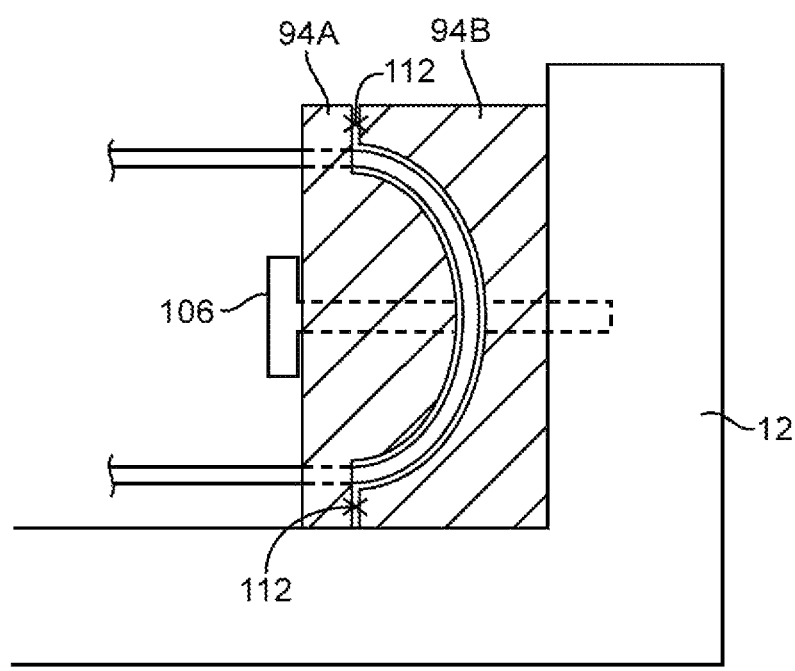
FIG. 22 is a cross-sectional side view of elastomeric guide structures that have been used to secure a flexible printed circuit to a housing in an electronic device in accordance with an embodiment.

In the illustrative configuration of FIG. 22, overbending prevention structures have been formed from mating inner elastomeric structure 94A and outer elastomeric structure 94B. Fasteners such as fastener 106 may be used to attach flexible printed circuit overbending prevention structures such as the illustrative overbending prevention structures of FIG. 22 to device structures such as housing 12. If desired, structures 94A and 94B may be joined using connections 112 (e.g. fused plastic regions formed by applying heat to structures 94A and 94B, regions joined by adhesive, etc.).

Figure 23:
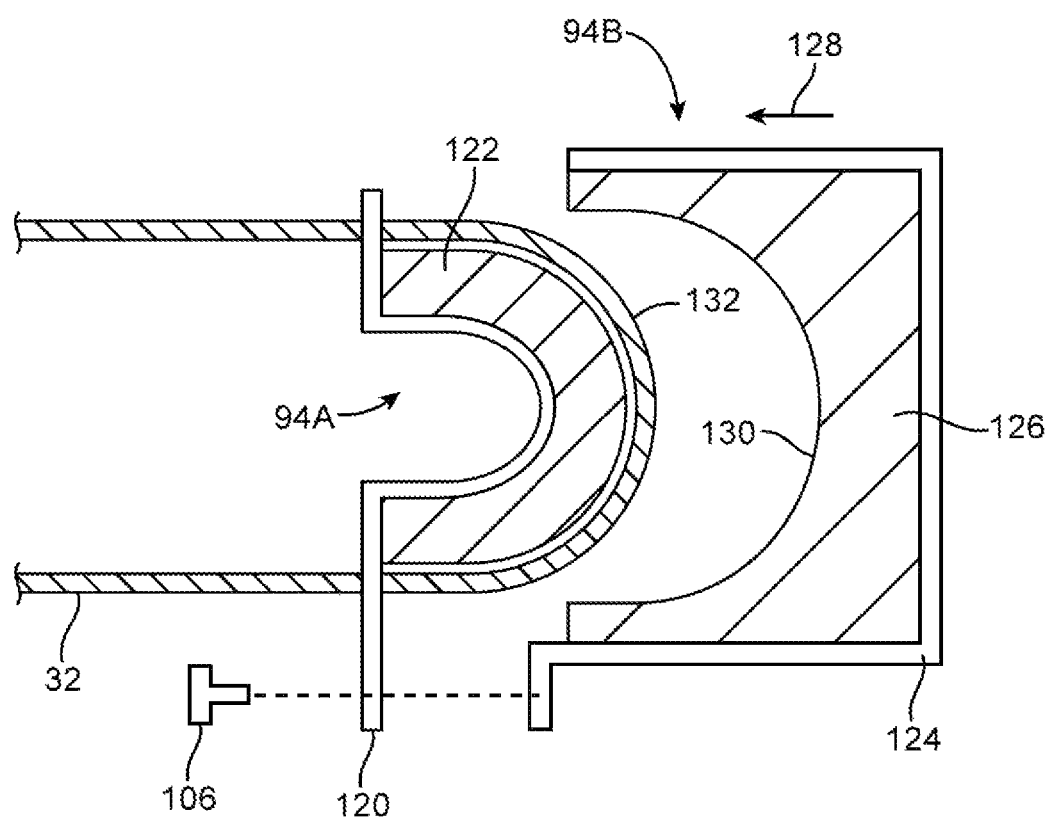
FIG. 23 is a cross-sectional side view of illustrative flexible printed circuit guide structures formed using molded elastomeric material on sheet metal support structures in accordance with an embodiment.

More than one material may be used in forming overbending prevention structures (and bumper structures). In the example of FIG. 23, members 120 and 124 may be formed from stamped sheet metal or rigid plastic (as examples). Elastomeric material 122 may be molded or otherwise attached to member 120 to form overbending prevention structure 94A. Elastomeric material 126 may be molded or otherwise attached to member 124 to form overbending prevention structure 94B. A fastener such as screw 106 or other attachment mechanisms may be used to join structures 94A and 94B together over flexible printed circuit 32 to form an overbending prevention structure that prevents flexible printed circuit 32 from being overbent. The structure of FIG. 23 may be configured to serve as a bumper by shaping member 120 to receive the edge of a printed circuit board or other potentially sharp object in device 10.

The foregoing is merely illustrative and various modifications can be made by those skilled in the art without departing from the scope and spirit of the described embodiments. The foregoing embodiments may be implemented individually or in any combination.

What is claimed is:

1. A signal cable, comprising:
   a flexible printed circuit with metal traces for carrying signals, wherein the flexible printed circuit has a bend;
   an elastic member coupled to the flexible printed circuit on opposing sides of the bend, wherein the bend is formed by contraction of the elastic member while the elastic member is coupled to the flexible printed circuit, wherein the bend comprises one of a plurality of bends in a service loop, and wherein the contraction of the elastic member forms the bends of the service loop; and
   a spacer attached to the flexible printed circuit that prevents over bending of the flexible printed circuit at the bend.

2. The signal cable defined in claim 1 wherein the elastic member is connected to the flexible printed circuit with fused plastic connections.

3. The signal cable defined in claim 1 wherein the flexible printed circuit includes a bend promotion feature aligned with the bend.

4. The signal cable defined in claim 3 wherein the bend promotion feature comprises a crease.

5. The signal cable defined in claim 1 further comprising an overmolded elastomeric overbending prevention structure that is overmolded over the flexible printed circuit at the bend.

6. The signal cable defined in claim 1 further comprising a structure attached to the flexible printed circuit that promotes formation of the bend in a desired direction.

7. An electronic device, comprising:
   a first electronic component;
   a second electronic component;
   a flexible printed circuit coupled between the first and second components, wherein the flexible printed circuit has a bend; and
   an elastic member coupled to the flexible printed circuit on opposing sides of the bend, wherein the bend is formed by contraction of the elastic member, wherein the bend is part of a service loop in the flexible printed circuit, and wherein the electronic device further comprises an over bending prevention structure at the bend.

8. The electronic device defined in claim 7 wherein the first component comprises a printed circuit board and wherein the second component is selected from the group consisting of: a touch sensor, a display, and an antenna.

9. Apparatus, comprising: a flexible printed circuit having a bend; and an overmolded elastomeric structure that is molded over the bend, wherein the bend forms part of a service loop and wherein the overmolded elastomeric structure covers the bend in the service loop.

10. The apparatus defined in claim 9 wherein the overmolded elastomeric structure is configured to serve as an overbending prevention structure that prevents the flexible printed circuit from bending more than a desired amount in the bend.

11. The apparatus defined in claim 10 wherein the overmolded elastomeric structure has strain relief features over portions of the flexible printed circuit.

12. The apparatus defined in claim 11 wherein the strain relief features comprise tapered integral portions of the overmolded elastomer structure.

13. The apparatus defined in claim 12 wherein the overmolded elastomeric structure comprises a recess that is configured to receive an edge of a printed circuit board.

14. The apparatus defined in claim 9 further comprising an elastic member attached to the flexible printed circuit.

15. The apparatus defined in claim 14 wherein the elastic member has opposing first and second ends that are attached to the flexible printed circuit at locations on opposing sides of the bend.

16. The apparatus defined in claim 15 wherein the elastic member is conductive.

17. Apparatus, comprising:
a flexible printed circuit having a bend;
a conductive elastomeric structure that holds the bend in the flexible printed circuit; and
an electronic component, wherein the conductive elastomeric structure covers and electromagnetically shields the electronic component.

18. The apparatus defined in claim 17 wherein the electronic component is mounted on the flexible printed circuit.

19. The apparatus defined in claim 17 further comprising:
a printed circuit board; and
an electronic component mounted on the printed circuit board, wherein the conductive elastomeric structure covers and electromagnetically shields the electronic component.

20. A signal cable, comprising:
a flexible printed circuit with metal traces for carrying signals, wherein the flexible printed circuit has a bend; and
a member coupled to the flexible printed circuit on opposing sides of the bend, wherein the bend is formed by contraction of the member while the member is coupled to the flexible printed circuit, and wherein the member comprises a shape memory alloy structure.

* * * * *